(12) United States Patent
Barsky et al.

(10) Patent No.: US 6,383,826 B1
(45) Date of Patent: May 7, 2002

(54) METHOD FOR DETERMINING ETCH DEPTH

(75) Inventors: Michael E. Barsky, Sherman Oaks; Richard Lai, Redondo Beach; Ronald W. Grundbacher, Hermosa Beach; Rosie M. Dia, Carson; Yaochung Chen, Rancho Palos Verdes, all of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/691,636

(22) Filed: Oct. 18, 2000

(51) Int. Cl.[7] .............................................. H01L 21/66
(52) U.S. Cl. ...................................................... 438/17
(58) Field of Search ....................... 438/17–18, 14–16, 438/5–13, 800; 324/765

(56) References Cited

U.S. PATENT DOCUMENTS 6,014,034 A * 1/2000 Arora et al. ................. 438/17
6,046,601 A * 4/2000 Yeh et al. .................... 324/796

OTHER PUBLICATIONS

Derwent absctract of Japanese Patent Publication No.; JP08097232A, Derwent–Acc–No 1996–244543, Derwent week 199625, Assignee NEC Corp).*

* cited by examiner

Primary Examiner—Charles Bowers
Assistant Examiner—Craig Thompson
(74) Attorney, Agent, or Firm—Antonelli, Terry, Stout & Kraus, LLP

(57) ABSTRACT

A method for determining the etch depth of a gate recess (26) in an InP based FET device (10). The source-drain, current-voltage (I-V) relationship is monitored during the etching process. As the etch depth increases, a kink is formed in the linear portion of the I-V relationship. When the kink current reaches a desired value, the etching is stopped. The kink current is a strong function of etch depth, so small differences in etch depth can be easily targeted. By controlling the etch depth, the characteristics of the transistor can be reproducibly controlled and optimized.

2 Claims, 3 Drawing Sheets

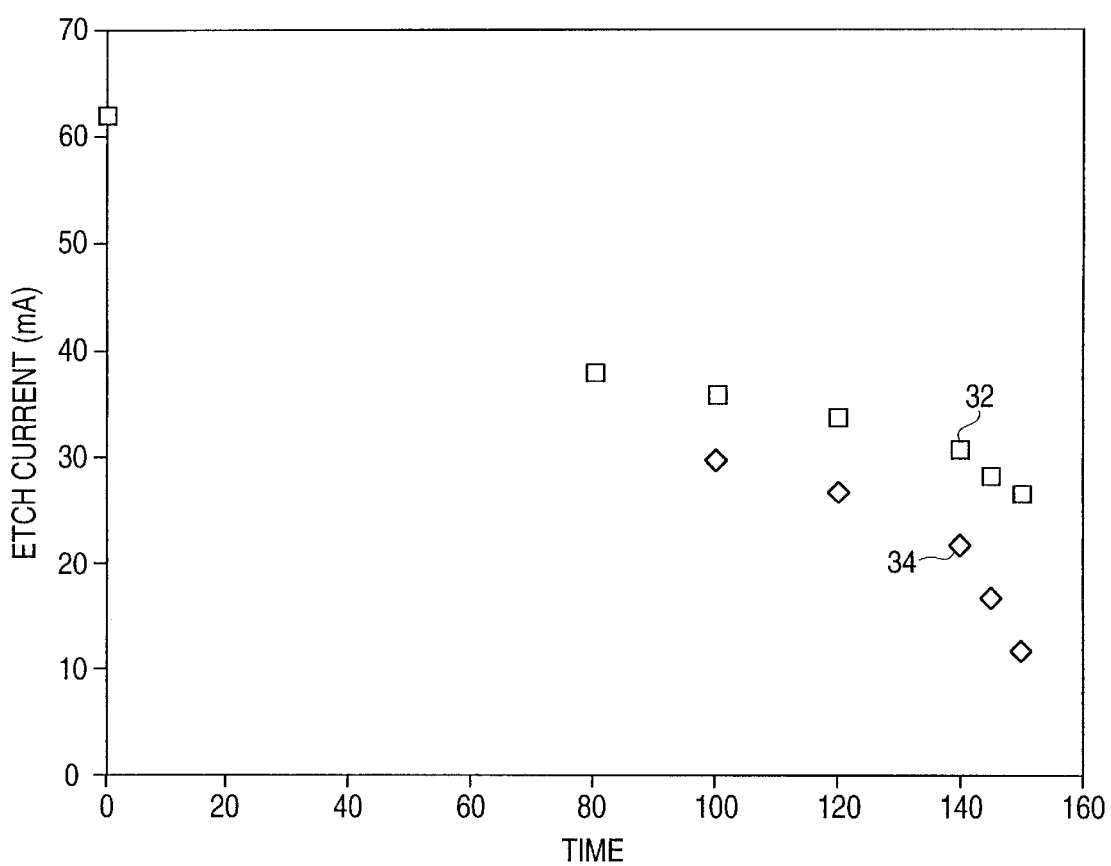

METHOD FOR DETERMINING ETCH DEPTH

BACKGROUND OF THE INVENTION

1. Field of the Invention

This invention relates generally to a method for determining the depth of an etching procedure and, more particularly, to a method for determining the depth of etching in a semiconductor device by determining the kink current in the source-drain, current-voltage relationship.

2. Discussion of the Prior Art

Three terminal field effect transistors are well known and are useful element in many electronic circuits, where a gate electrode is used to control the current flow between the source and drain regions. As shown in FIG. 1, such a device 10 includes a substrate 12, a source region 14, a drain 16, a channel layer 18 extending between the source and drain, a Schottky barrier layer 20 and a cap layer 22. The gate electrode 24 is preferably placed in direct contact with the Schottky barrier layer. Thus, it is necessary to etch the cap layer and place the gate electrode within a recess 26. By doing this, the source resistance is kept low and the frequency performance of the device is increased. However, the recess depth must be carefully determined to optimize device performance.

Prior art GaAs and InP based FETs measured the saturation current, 32, of the source-drain (S-D), current-voltage (I-V) relationship in order to determine the recess etch depth. After each etching cycle, the I-V curve is remeasured to determine the change in the saturation current, 32. As seen in FIG. 3, as the etching time increases on an InP based FET, the saturation current, 32 (shown as square points) decreases. When this current decreases to a predetermined value, the desired etch depth has been reached. However, the saturation current does not decrease strongly with respect to etch time, so a very careful measurement must be made in order to determine the etch depth. Since the gate electrode is formed using the same mask as the recess etch, the I-V measurement must be taken through a photoresist layer. Small changes in I-V current are difficult to measure since contact must be made through the photoresist layer.

SUMMARY OF THE INVENTION

Accordingly, one object of the present invention is to provide a method for etching a gate recess for an InP based FET device.

Another object of this invention is to control the etch depth in an InP based FET device by referencing the kink current in the source to drain I-V relationship.

Another object of this invention is to provide a method for forming an InP based FET device wherein a gate electrode is placed in a recess, the depth of which is determined by the kink current of the source-drain, current-voltage relationship.

A further object of this invention is to use a measured kink current to determine the time of etching of an InP based FET device.

Briefly, these and other objects of the invention are achieved by providing a measurement of the source-drain current voltage relationship before etching the device. After each cycle of etching, the relationship is again examined. The kink current is then examined and the etching time determined based on this kink current.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3 is a graph of current versus time for the saturated current and kink current according to the present invention.

DESCRIPTION OF THE PREFERRED EMBODIMENTS

Figure 1:
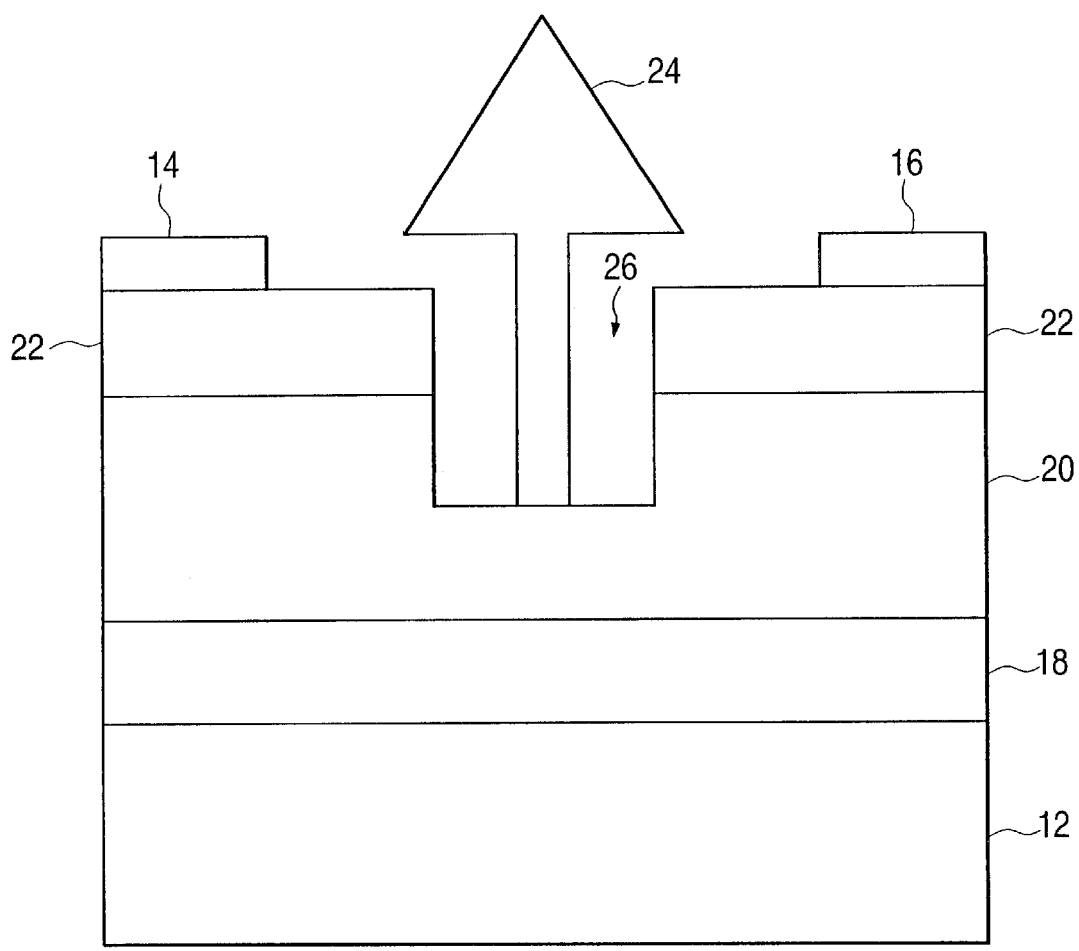
FIG. 1 is a diagram of a FET device according to the present invention.

Referring now to the drawings, wherein like reference numerals designate identical or corresponding parts throughout the several views, and more particularly to FIG. 1 thereof, wherein an FET device is shown. This device is similar to that found in the prior art. In order for the gate electrode to be in contact with the Schottky barrier layer, it is necessary for the cap layer to be etched. In order to determine the amount of etching, the kink current is targeted to a predetermined value.

Figure 2A:
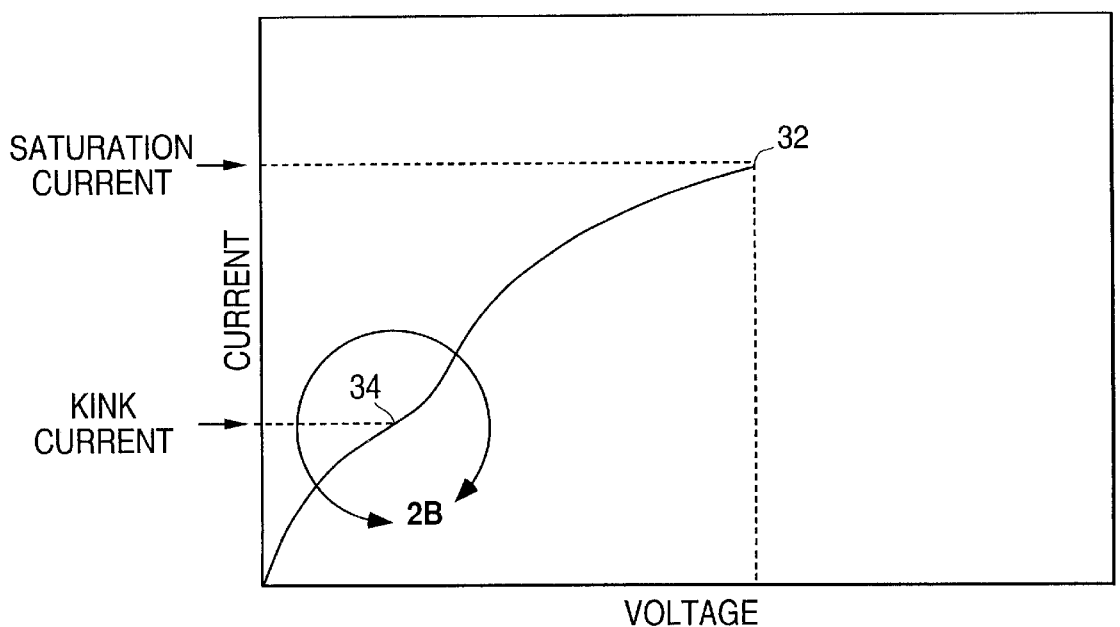
FIG. 2 is a graph of the source-drain, current-voltage relationship for an InP based FET.
Figure 2B:
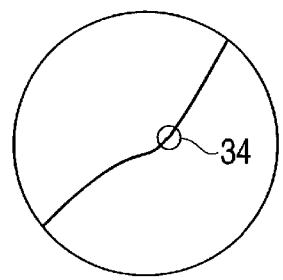

As seen in FIG. 2, the graph of the source-drain, current-voltage relationship includes a linear portion 30 which continues throughout most of the first two thirds of the graph and which then flattens out until a saturation current 32 is reached. However, in the middle of the linear range, there is a reduction in the current which is generally referred to as a kink 34. Before the device is etched, the linear relationship contains no kink. As the device is etched, the kink becomes more apparent until a sharp kink is reached as indicated in the circular inset.

As indicated in FIG. 3 by the diamond shaped points, the kink current 34 becomes smaller as the etching time increases. This is similar to the effect on the saturation current, also indicated in the same figure. However, the kink current produces a greater reduction of current for a given etching time compared to the saturated current. For example, between 145 and 150 seconds, the saturated current drops 1.5 mA, while the kink current drops 5 mA. Thus, it is easier to measure the difference in the kink current than in the saturated current. Since the exact amount of kink current is more easily determined, it is easier to stop the etching at the correct moment so that the depth of the etch is closer to the exact amount desired. In addition, the kink current is more strongly related to the etch time than the saturated current, so small changes in etch depth correspond to large changes in the kink current. Thus, an exact etch depth can be targeted more accurately, and, a higher percentage of the devices are formed with the desired characteristics.

Thus, by using the kink-current method, it is easier to obtain an exact etch depth as compared to using a saturated current method. The kink-current method affords a more accurate determination of the depth producing a transistor with the desired characteristics. By using the kink current method rather than the more traditional saturation current method, a better device is therefore, obtained.

Numerous additional modifications and variations of the present invention are possible in light of the above teachings. It is therefore, to be understood that within the scope of the appended claims, the invention may be practiced otherwise than as specifically described herein.

What is claimed is:

1. A method of determining the etch time of a gate recess in an FET device, wherein said FET device includes a channel layer, a Schottky barrier layer, and a cap layer, comprising the steps of:

determining the source-drain, current-voltage relationship of the device before any etching;

etching said FET device for a period of time to form said gate recess;

determining the source-drain, current-voltage relationship after etching;

measuring a kink current in said source-drain, current-voltage relationship to determine the depth of said gate recess; and repeating said etching, determining and measuring steps;

ending said etching when said kink current reaches a desired value indicating a desired depth of said gate recess.

2. The method according to claim 1, wherein said source-drain, current-voltage relationship develops a kink in the linear region as etching progresses.

* * * * *